(12) United States Patent
Jung et al.

(10) Patent No.: US 7,940,439 B2
(45) Date of Patent: May 10, 2011

(54) METHOD FOR GENERATING A MICROMECHANICAL STRUCTURE

(75) Inventors: Denis Jung, Dresden (DE); Christian Drabe, Dresden (DE); Thilo Sandner, Dresden (DE); Harald Schenk, Dresden (DE); Thomas Klose, Dresden (DE); Alexander Wolter, Dresden (DE)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 491 days.

(21) Appl. No.: 12/058,835

(22) Filed: Mar. 31, 2008

(65) Prior Publication Data

US 2008/0242049 A1     Oct. 2, 2008

(30) Foreign Application Priority Data

Apr. 2, 2007   (DE) .......................... 10 2007 015 720
Mar. 7, 2008   (DE) .......................... 10 2008 013 116

(51) Int. Cl.
*G02B 26/08*     (2006.01)
*H01L 21/46*     (2006.01)

(52) U.S. Cl. ..................................... 359/198.1; 438/457
(58) Field of Classification Search .............. 359/198.1, 359/224.1, 290; 438/457
See application file for complete search history.

(56) References Cited

U.S. PATENT DOCUMENTS

| 5,976,390 A | 11/1999 | Muramatsu |
| 2005/0013087 A1 | 1/2005 | Wu et al. |
| 2008/0050561 A1 | 2/2008 | Joisten et al. |

FOREIGN PATENT DOCUMENTS

| FR | 2 880 731 A1 | 7/2006 |
| WO | 2006/035378 A1 | 4/2006 |

OTHER PUBLICATIONS

English language translation of an Official Communication issued in corresponding Chinese Patent Application No. 2008100903845, mailed on Jun. 23, 2010.

*Primary Examiner* — William C Choi
(74) *Attorney, Agent, or Firm* — Keating & Bennett, LLP

(57) ABSTRACT

In a method for manufacturing a micromechanical structure, first a two-dimensional structure is formed in a substrate. The two-dimensional structure is deflected from the substrate plane by action of force and fixed in the deflected state.

15 Claims, 7 Drawing Sheets

METHOD FOR GENERATING A MICROMECHANICAL STRUCTURE

CROSS-REFERENCE TO RELATED APPLICATIONS

This application claims priority from German Patent Application No. 102007015720.9, which was filed on Apr. 2, 2007, and from German Patent Application No. 102008013116.4, which was filed on Mar. 7, 2008, which are both incorporated herein in their entirety by reference.

TECHNICAL FIELD

The invention relates to generating micromechanical three-dimensional structures by means of mechanic forward deflection of two-dimensional structures from a substrate or wafer plane and subsequent fixing of the same in the deflected state.

BACKGROUND

Known methods for deflecting structures from a wafer plane use, for example, an intrinsic material tension of the substrate material or a substrate layer combination, for warping the substrate at defined locations. The warping may then lead to tipping or deflecting the structures from the substrate. The material tension may be intrinsic in material pairings or may be impressed, for example, by a so-called actor working according to the piezoelectrical, electrostatic or thermal principle, for example. With an intrinsic material tension, the deflection which may be achieved in this process is static. By so-called material creeping or drift occurrences, the deflection may vary in time. As a result of different thermal expansion coefficients of multiple-layer material combinations, a significant temperature tracking of the entering angle and, thus, the device structure results. The deflection of two-dimensional structures with an actor depends on the actor control and the long-term stability of the system. A static deflection of two-dimensional elements via an actor system is necessarily connected with a power intake of the actor. As a rule, however, the curvatures of the substrate which may be achieved by material tensions are small. Additionally, large space requirements result on the substrate to build up the material tension and realize significant entering angles of the structures to the substrate. These may be enlarged by the local thinning of the substrate, which, however, weakens the mechanical stressability of the structure to be deflected and may lead to low-frequency modes of vibration.

SUMMARY

According to an embodiment, a method for manufacturing a micromechanical structure may have the steps of: forming a two-dimensional structure in a substrate; deflecting the two-dimensional structure from the substrate plane by action of force; and fixing the two-dimensional structure in the deflected state.

BRIEF DESCRIPTION OF THE DRAWINGS

Embodiments of the present invention will be detailed subsequently referring to the appended drawings, in which.

DETAILED DESCRIPTION

Figure 1:
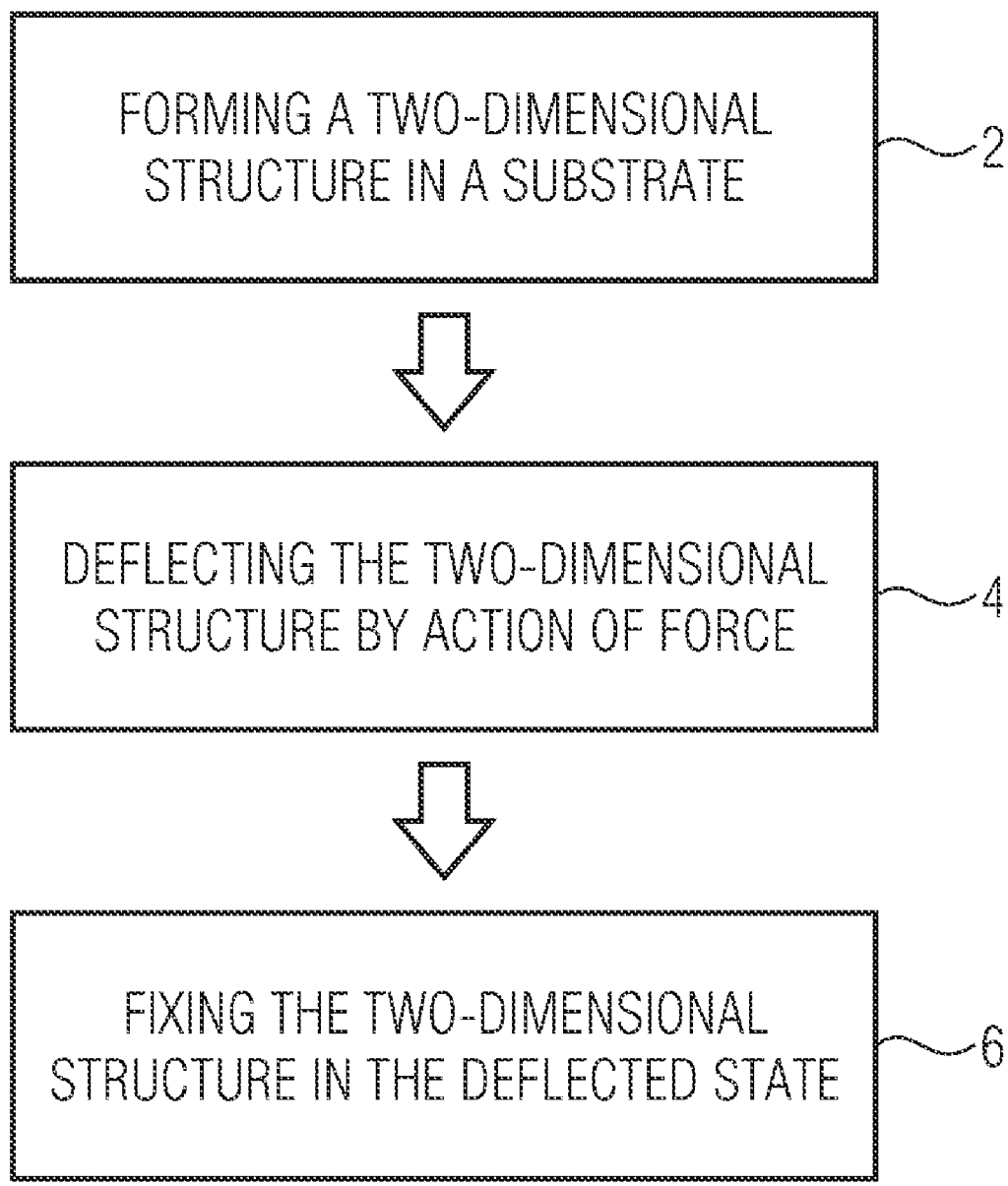
FIG. 1 is a flowchart of a method for microtechnical generation of micromechanical structures according to an embodiment of the invention.

Referring to the flowchart in FIG. 1, the method for manufacturing a three-dimensional micromechanical structure of two-dimensional elements is explained in detail. The method comprises the step of forming 2 a two-dimensional structure in a substrate, deflecting 4 the two-dimensional structure from the substrate plane by action of force for forming the three-dimensional structure, and fixing 6 the two-dimensional structure in the deflected state.

All structures manufactured in planar technology and volume micromechanics that, after being deflected from a substrate plane and being fixed there, form a three-dimensional structure with the substrate are referred to as two-dimensional structures. The invention may allow the deflection of structures with large entering angles and/or an offset to the substrate and the later fixing in the deflected state. That is, it opens up a third dimension to the substrate, or wafer, plane. This may be used, for example, to realize an electrostatic drive with a three-dimensional electrode structure, a so-called angular vertical comb (AVC), or a staggered vertical comb (SVC), which may generate forces and moments out of the wafer plane over a large translation, or rotation, area. Such drives are of interest for many Microsystems, in particular for microscanners for image projection. An electrostatic drive thus constructed is suitable for a linearization of the vibration form or for continuous switching between static actor positions, for example.

Forming a two-dimensional structure in a substrate may occur on the wafer plane, e.g. in a silicon wafer. The forming, or fabrication, of the two-dimensional structure in the substrate or wafer may be made such that the two-dimensional structure is released, that is, is deflectable and is still connected to the wafer via fixed bearings. The two-dimensional structure may be manufactured, for example, in the so-called silicon-on-insulator (SOI) technique, and after etching the silicon layer, the fixed bearings may accordingly remain on the underlying oxide layer. Thus, after fabricating and releasing, the two-dimensional structure may still be retained in the substrate via the fixed bearings provided for this purpose. The fixed bearings may determine the degree of freedom for the extraction of the structure from the plane. When deflecting the two-dimensional structure from the substrate plane by action of force for forming the three-dimensional structure, the force introduction may shift, tip or also rotate the two-dimensional device, or the two-dimensional structure, out of the wafer plane, according to its bearing.

The two-dimensional structure may be deflected from the substrate plane in different ways. It is conceivable that the necessary forces and moments for deflecting the structure may be exerted by intrinsic material stress, by the force effect, or moment effect, of a so-called actor, of a micromanipulator, by the effect of an outer force field or a relative acceleration between the substrate and the two-dimensional structure.

Intrinsic material stress may be generated in the device already in the fabrication process of the two-dimensional structures by selecting suitable material layer combinations, such as of silicon dioxide and silicon ($SiO_2$/Si). These structures may be so-called bimorph structures, which, upon heating, lead to a deformation, e.g. by selecting suitable material layer combinations comprising a different thermal expansion coefficient. In order to prevent the deflection, or the swing-out, of the two-dimensional structure during the fabrication process, secondary holding structures may be additionally attached to the actual two-dimensional primary structure, which are then removed in a later point of time in the fabrication process of the micromechanical device, for example, by breaking, melting, by selective etching or stress machining, and are subsequently deflected by the corresponding intrinsic material stress.

Different working principles are available for erecting the two-dimensional structure by help of a so-called actor. For example, actors may function according to the electrostatic, the magnetostatic, the electrostrictive, the magnetostrictive, the piezoelectrical or the thermal principle. Actors based on other physical/chemical principles, which may be utilized to perform mechanical work upon a signal or an excitation are also conceivable.

It is also conceivable that deflecting 4 the two-dimensional structure from the substrate plane by action of force for forming the three-dimensional structure is performed with a so-called micromanipulator. When extracting the three-dimensional structure with a micromanipulator, the micromanipulator may be constructed, for example, as a microgripper, a needle, a mandrel or, for example, also as a fluid nozzle or a vacuum suction gripper. For this purpose, the two-dimensional structures may be provided with mechanical contact areas at a suitable location, via which then a force or a moment entry may occur with the micromanipulator onto the device. By this action of force, the two-dimensional structure may be deflected, rotated, tipped or shifted, and the three-dimensional structure may thus be formed.

Gravitation, for example, may represent an outer force field for deflecting the two-dimensional structure. The acting of magnetic or electric fields on a two-dimensional structure comprising certain magnetic materials, or a certain electrical charge, is also conceivable. In another embodiment, the force field is generated by a pneumatic pressure field.

A relative acceleration between the substrate and a vertically moveable two-dimensional structure may be generated, for example, by vertically accelerating the substrate with the accordingly formed two-dimensional structure. Thereby, forces act on the moveable two-dimensional structure which may lead to its deflection.

Fixing 6 the two-dimensional structure in the deflected state may be made in a positive, nonpositive or integral manner. Mechanical hooks or latches which block or arrest the two-dimensional element in the deflected state may be used as a positive fixing method. For example, sticking, bonding, soldering, welding or alloying may be performed as an integral fixing method. By adhesion forces, clamping forces and by frictional forces the deflected two-dimensional elements may be mounted in a nonpositive manner.

After a final fixing of the two-dimensional structure in the deflected state, the two-dimensional element forms a three-dimensional element, or a three-dimensional device or structure, with the structured wafer plane or substrate plane. By the described method for manufacturing three-dimensional structures, the two-dimensional structures may be erected to three-dimensional structures only after completion of the fabrication process. That is, during the entire fabrication process, they may remain in the substrate plane, which is why they are better protected against damage during the further manufacturing process. By selecting the method for deflecting the two-dimensional structure, or by selecting the principle for the force or moment entry, also very large deflections of the two-dimensional structure from the substrate plane may be realized. By fixing in the deflected state, an increased mechanical stability of the three-dimensional structure may be achieved. Additionally, after fixing according to one of the above-described methods, no additional energy has to be input into the system, or device, for maintaining the deflection.

Figure 2:
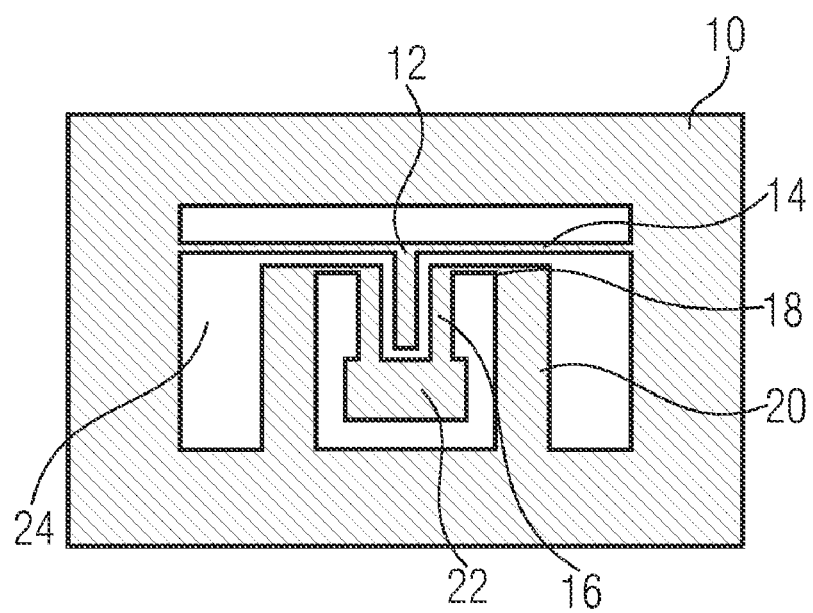
FIG. 2 is a top view illustration of a two-dimensionally structured substrate.

FIG. 2 shows the schematic top view of a two-dimensional structured substrate 10 according to an embodiment of the present invention. The two-dimensional structured substrate 10 comprises an electrode structure in which a first electrode 12 is mounted on a torsion spring 14. The counterelectrode 16 is mounted on a cantilever 20 via a torsion spring 18 and may be deflected by force acting vertically on area 22 around torsion axis 18. The regions 24 do not comprise any substrate material and may also represent etched trenches in a substrate, for example. For example, this may be a structure manufactured in the SOI technique, and regions 24 may accordingly represent single-crystalline silicon regions removed by etching. Accordingly, frame 10 may comprise silicon.

Thus, FIG. 2 shows a two-dimensional structure formed in the substrate, wherein in this embodiment, the two-dimensional element comprises an electrode structure. FIG. 2 shows the basic principle of a counterelectrode fabricated from a two-dimensional element, which may be mechanically tipped, from the substrate plane, to a three-dimensional element. By twisting the counterelectrode 16, a three-dimensional electrode structure with bent counterelectrodes, that is, an AVC structure, results from a planar two-dimensional electrode configuration between the electrodes 12 and 16.

Figure 3:
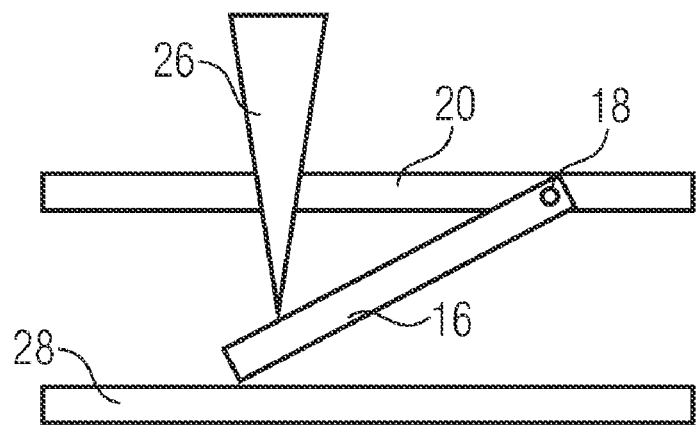
FIG. 3 is a schematic side view of the two-dimensionally structured substrate of FIG. 2 with a micromanipulator for deflecting the two-dimensional structure.

FIG. 3 illustrates the schematic sectional side view of the two-dimensional electrode structure of FIG. 2 after deflection for forming the three-dimensional structure. A section through substrate 10 is illustrated, wherein in this embodiment, the counterelectrode 16 is twisted around the rotational axis of the torsion spring 18 by the force entry on area 22 resulting from the counterelectrode 16 (see FIG. 2) with a micromanipulator 26 here formed as a mandrel, and, thus, tips out of the substrate plane 10. The mechanical rotational angle of counterelectrode 16 may be bounded by bounding the vertical stroke with a further substrate layer 28, for example. In this embodiment, the rotational angle of counterelectrode 16 does not depend on the lateral offset of the point of entry of the micromanipulator 26 on area 22, bending of the counterelectrode 16 or plate 22. In principle, counterelectrode 16 may be fixed in the deflected position by an additional element or may be integrally connected to substrate 28.

Figure 4:
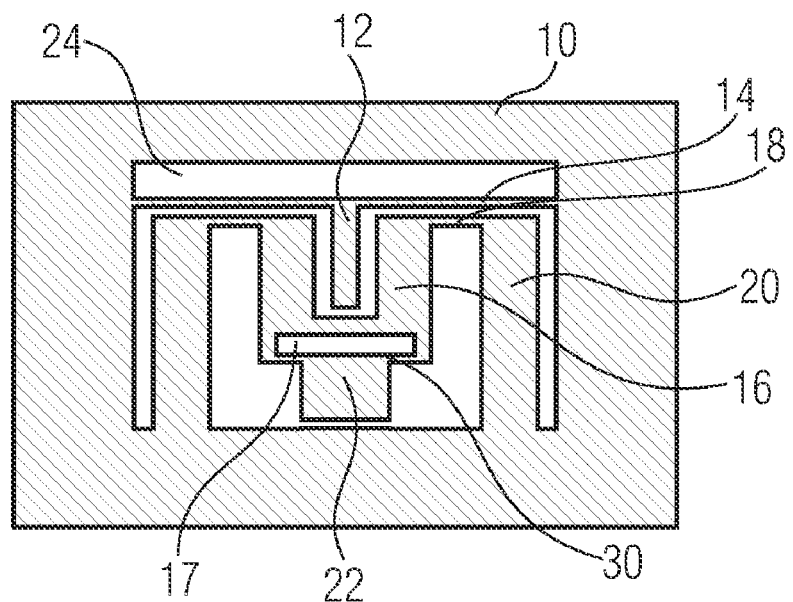
FIG. 4 is the top view illustration of the basic structure of FIG. 2 complemented by a parallel hinge.

FIG. 4 shows a further embodiment of a two-dimensionally structured substrate 10 with an electrode structure. The two-dimensional structure comprises a similar basic structure as described in FIG. 2. An electrode 12 is mounted on a torsion spring 14 supported in a frame structure formed by substrate 10. The corresponding counterelectrode 16 is mounted on a cantilever 20 via a torsion spring 18 and may be deflected around the torsion axis 18 by a vertical force onto area 22. Additionally, the two-dimensional electrode structure comprises a further torsion hinge 30.

Figure 5:
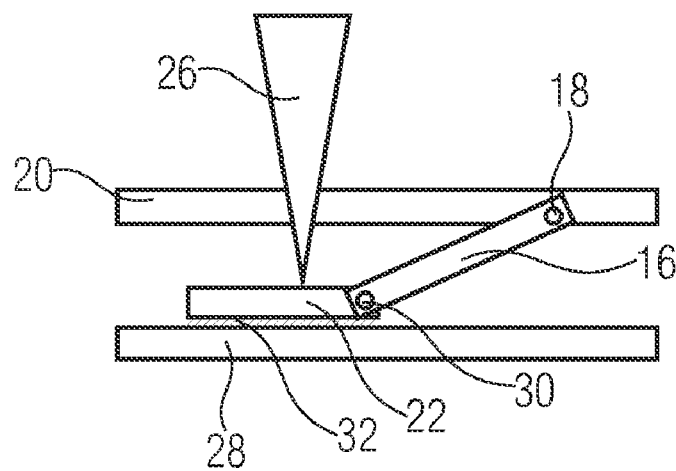
FIG. 5 is a schematic side view of the structure of FIG. 4.

In FIG. 5, the associated schematic sectional side view is illustrated. The micromanipulator, e.g. in the form of a mandrel or a needle, may vertically exert a force on plate 22. Thereby, the counterelectrode 16 connected with plate 22 via torsion spring 30 rotates around the torsion axis of torsion spring 18. Upon contact with substrate 28, plate 22 rotates around the same angle in the opposite direction, relative to counterelectrode 16 around torsion axis 30. Thereby, plate 22 may ideally be pressed parallel onto the further substrate layer 28. The stroke of plate 22 is invariant to an area-parallel offset of the point of attack of micromanipulator 26, in the region of the plate, when it presses the plate to the substrate 28. Then, the stroke of the plate only depends on the stroke of the micromanipulator. The further substrate layer 28 bounds the vertical stroke of area 22 and, thus, the rotational angle of the counterelectrode 16 to substrate 10 and cantilever 20. If the plate is pressed to the further substrate 28, the angle of counterelectrode 16 is geometrically clearly determined by the vertical distance of substrate 10 and the further substrate layer 28 and the length of the lever arm, the counterelectrode. Plate 22 may now be integrally connected to the further substrate 28, for example, which is exemplarily illustrated by a sticking layer 32 in FIG. 5. It is also conceivable to connect this plate with substrate 28 by adhesive forces or by bonding.

Figure 6:
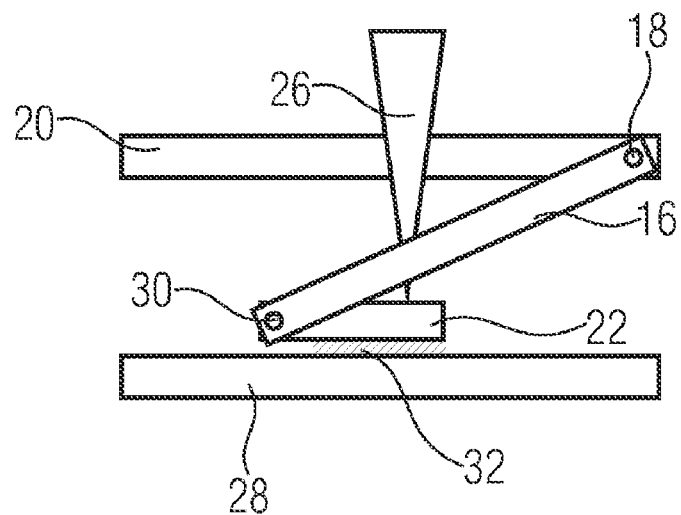
FIG. 6 is a schematic side view of the structure according to a further embodiment of the invention.

FIG. 6 shows a further schematic sectional side view of a three-dimensional structure. The three-dimensional structure in FIG. 6 results from the three-dimensional structure in FIG. 5 by plate 22 being twisted around the rotational axis 30 by an angle of 180°, and the micromanipulator pressing on plate 22 through recess 17, for example. The function of both structures is identical. Plate 22, in turn, may be fixed on substrate 28 by a sticking layer 32.

Figure 7:
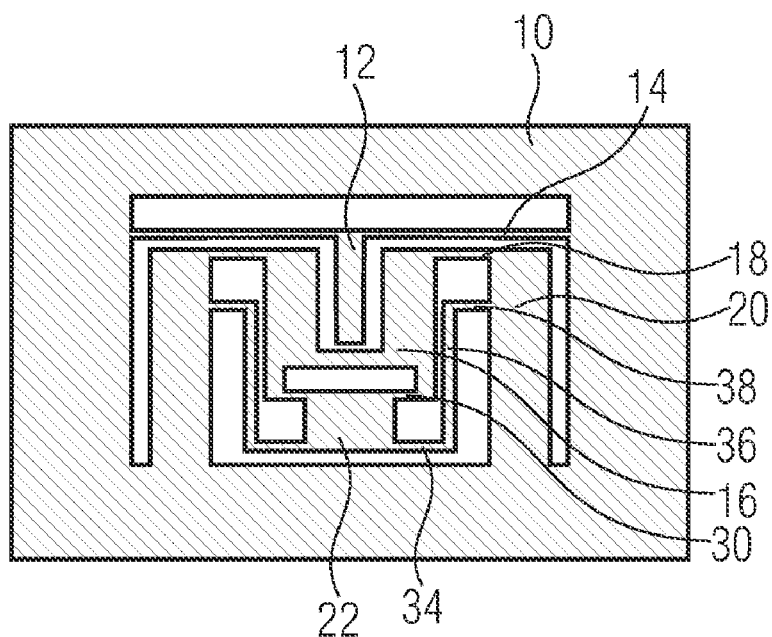
FIG. 7 is a top view illustration of a structured substrate extended by a parallel hinge, according to a further embodiment of the present invention.

In FIG. 7, a further embodiment of a two-dimensional structure in a substrate with an electrode structure is shown. The two-dimensional structure in a substrate 10 comprises an electrode 12 mounted on a torsion spring 14. The counterelectrode 16 is connected to cantilever 20 via torsion spring 18 and to plate 22 via torsion spring 30. Additionally, plate 22 is mounted via a further torsion spring 34 to a lever arm 36 which is supported on cantilever 20 via a further torsion spring 38. The lever arm between the torsion springs 18 and 30 is identical to the lever arm between torsion springs 38 and 34. Thus, the two-dimensional structure in FIG. 7 contains the basic structure illustrated in FIG. 2, which is complemented by a parallel hinge.

Figure 8:
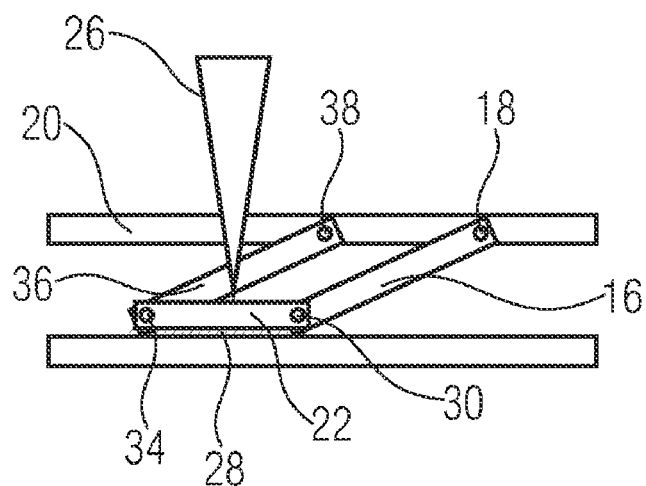
FIG. 8 is a schematic side view of the structure of FIG. 7 including a micromanipulator tip.

FIG. 8 shows a sectional side view of FIG. 7. Micromanipulator 26 vertically exerts a force on plate 22. Thereby, counterelectrode 16 and cantilever 36 rotate around the torsion axes of torsion springs 18 and 38. Plate 22 rotates around the same angle in the opposite direction, relative to counterelectrode 16 and lever 36 around torsion axes 30 and 34. Thereby, area 22 remains parallel to cantilever 20 and to the other substrate 28. The stroke of plate 22 is invariant to an area-parallel offset of micromanipulator 26, in the region of plate 22. In turn, it only depends on the stroke of micromanipulator 26. The vertical stroke of area 22 may again be bounded by substrate 28 and, thus, the rotational angle of counterelectrode 16 to the substrate and cantilever 20. If plate 22 is pressed to substrate 28, the angle of counterelectrode 16 is geometrically clearly determined by the vertical distance of cantilever 20 to the substrate surface 28 and the length of the lever arms given by electrode 16 and 36. Now, plate 22 may be integrally connected to the substrate, for example, e.g. by sticking.

By supporting the deflectable two-dimensional structure as a parallel hinge, a parallel shift of the contact area led in parallel to the force introduction occurs in the deflection of the structure by means of the micromanipulator, or the microactuator. The absolute tipping angle of the two-dimensional structure then substantially only depends on the height of the parallel shift of the contact area caused by lowering the micromanipulator structure 26. The lateral position of the force introduction within contact area 22 does not play any role so that the resulting tipping angle of the two-dimensional structure results independently of the lateral adjustment tolerance for the micromanipulator. This means that also plural micromechanical devices may be realized simultaneously with identical tipping angles with a large reproducibility as well as with better symmetry of the device.

Figure 9:
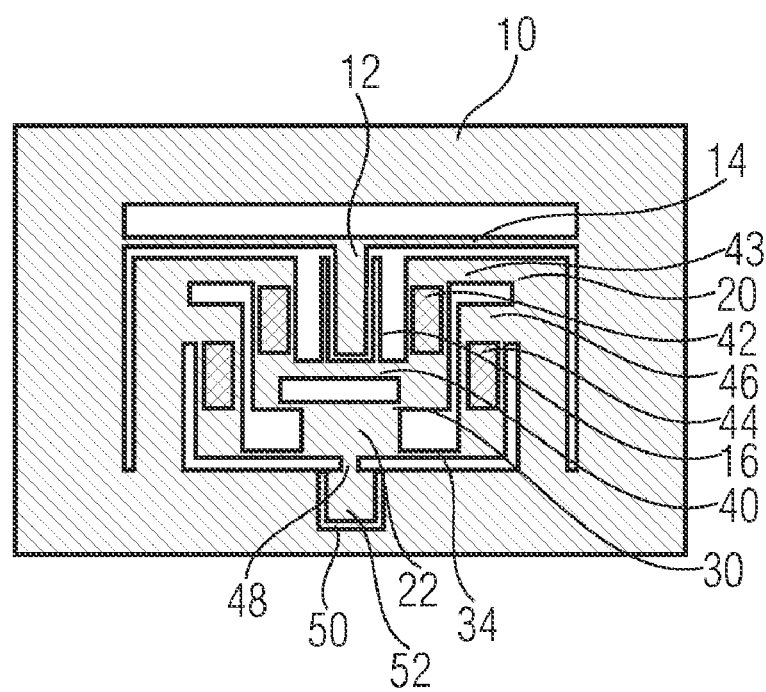
FIG. 9 is a top view illustration of a structured substrate with bimorph beams according to a further embodiment of the present invention.

FIG. 9 illustrates a further embodiment of the present invention. FIG. 9 contains the basic structures of FIG. 2 and is complemented by a parallel hinge with bimorph lever arms. Counterelectrode 16 is anchored with a bimorph beam 42 via a carrier 40. The bimorph beam, or lever 42, is supported on cantilever 20 via carrier 43 and on plate 22 via torsion spring 30. Plate 22 is additionally connected with the bimorph beam 44 via torsion spring 34. This bimorph beam is supported on cantilever 20 via carrier 46. Additionally, plate 22 is supported on the substrate, or frame 10, via a ridge 48. If a sufficiently high voltage is applied between frame 10 and region 52 electrically insulated by an insulation trench 50, ridge 48 may be melted through. Thereby, a motion of plate 22 is enabled. By the intrinsic material tension of the bimorph lever arms 42 and 44, the bimorph beams curve. Plate 22 is vertically moved out of the substrate plane, or frame plane, 10 and counterlectrode 16 is tipped to this plane.

Figure 10:
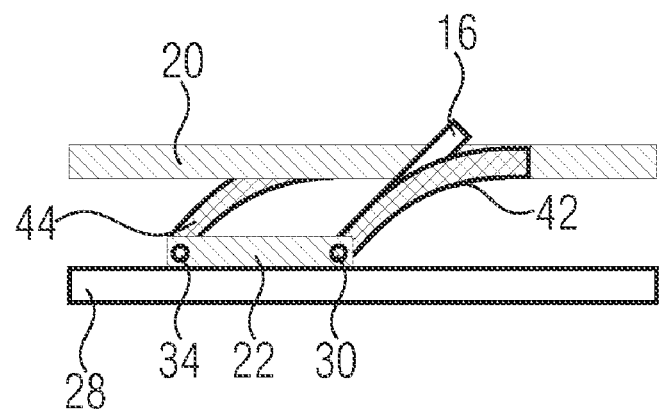
FIG. 10 is a schematic side view of the structure of FIG. 9.

FIG. 10 shows the schematic sectional side view of FIG. 9. If the bimorph lever arms 42 and 44 supported on cantilever 20 via carriers 43 and 46 curve due to their intrinsic material tension, their free ends will move out of the substrate plane and enclose an angle with substrate plane 10. The counterelectrode 16 mounted with the free end of lever 42 via carrier 40 encloses the same angle with the substrate plane. In addition to the rotation, a lateral offset occurs, which depends on the curvature of the lever, its length and the accurate position of carrier 40 on the lever. Since the relative orientation of the free lever ends to each other changes yet the relative distance remains unchanged, plate 22 rotates in opposition to the twisting angle of the free lever ends relative to the associated lever arm around the axes of torsion springs 30 and 34. Plate 22 remains parallel to substrate plane 10. If plate 22 is deflected far enough by the bimorph lever arms, it may be integrally mounted on substrate 28.

Figure 11:
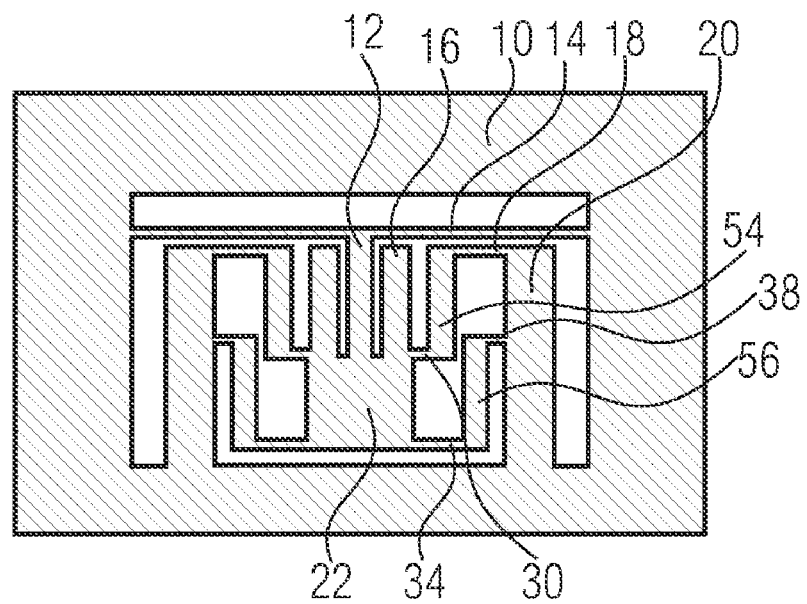
FIG. 11 is a top view illustration of a structured substrate comprising a four-bar hinge according to a further embodiment of the present invention.

FIG. 11 contains an electrode 12 and its counterelectrode 16 as a basic structure. Electrode 12 is connected to the substrate or frame 10 via a torsion spring 14. Counterelectrode 16 is suspended on the substrate via a four-bar hinge 22, 20, 56, 54, wherein the lever length of 54 corresponds to that of 56, with the bearings 18, 38, 30, 34 which are formed as torsion springs. Counterelectrode 16 and plate 22 connected therewith may be lowered vertically to the sign level, that is, parallel to substrate 10. A three-dimensional electrode geometry develops, wherein electrode 12 and counterelectrode 16, after deflecting structure 16 and 22 out of substrate plane 10, are present as a layered electrode arrangement, i.e. the so-called staggered vertical comb (SVC).

Figure 12:
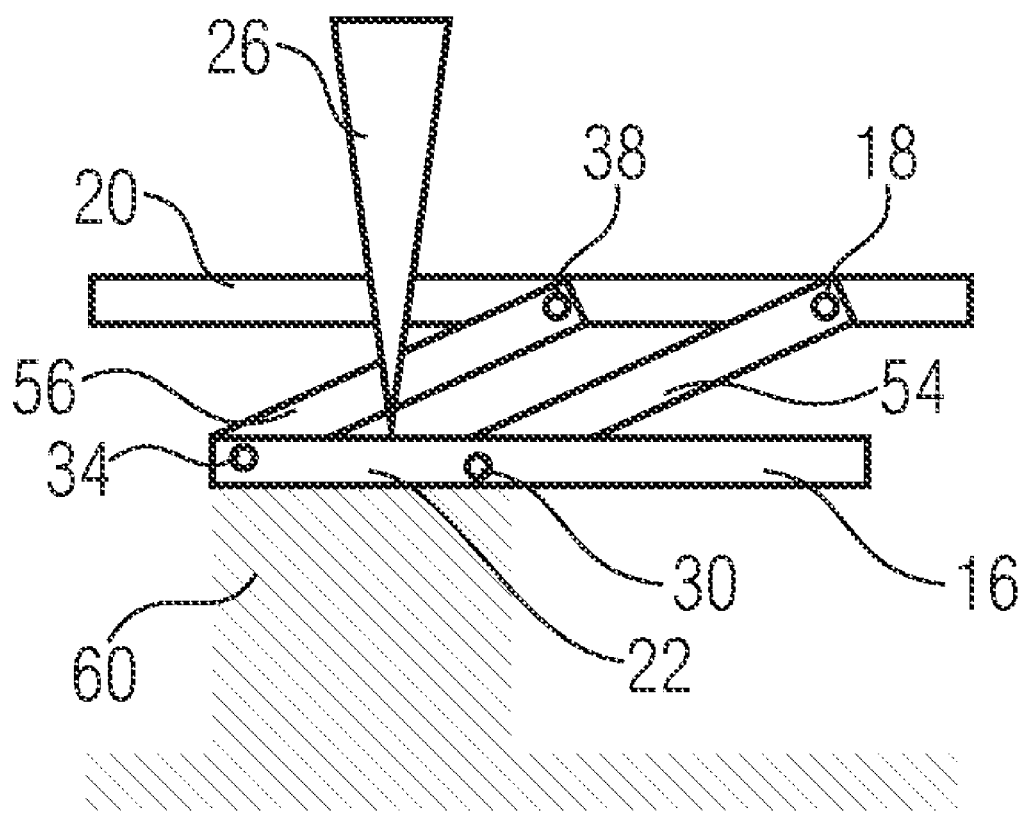
FIG. 12 is a schematic side view of the two-dimensional structure of FIG. 11 according to a further embodiment of the present invention.

FIG. 12 illustrates the schematic sectional side view to FIG. 11. For example, if a vertical force is exerted on plate 22 with a micromanipulator 26, the plate sinks, together with counterelectrode 16, parallel to cantilever 20. Here, lever arms 54 and 56 twist relative to elements 20 and 22. Torsion springs 18 and 38 are twisted relative to the twist 16 to 20 and torsion springs 30 and 34 relative to the twist of 16 and 22. For example, the deflection may be positively bounded by a mesa structure 60. The mesa structure may be additionally used to integrally fix plate 22 in the deflected position.

The discussed embodiments of the present invention show a microtechnical process method for generating three-dimensional structures from two-dimensional structures in a substrate, wherein the method may comprise three process steps. The fabrication of two-dimensional structures in a substrate, erecting the two-dimensional structures from the substrate plane and fixing the two-dimensional structures in the deflected state, so that they form a three-dimensional structures with the substrate. Further, the substrate may comprise two-dimensional structures which are fabricated in a wafer compound, released and connected to the wafer via fixed bearings, and which are capable of moving out of the wafer plane by an internal or external, direct or indirect force or moment action and may there be fixedly anchored in an integral, positive or nonpositive manner. After release from the substrate, the two-dimensional structures may be moved out of substrate plane by intrinsic material tension of bimorph lever elements and be fixedly anchored in the fully deflected position in an integral, positive or nonpositive manner. After release from the substrate, the two-dimensional structures may be moved out of the substrate plane or deflected by action of a micromanipulator and be anchored in the fully deflected position in an integral, positive or nonpositive manner. After release from the substrate, the two-dimensional structures may be deflected from the substrate plane also by an actor, for example, and be fixedly anchored in the fully deflected position in an integral, positive or nonpositive manner. After release from the substrate, the two-dimensional structures may be deflected from the substrate plane by the effect of an outer force field and be fixedly anchored in the fully deflected position in an integral, positive or nonpositive manner. As already mentioned above, the two-dimensional structures may be deflected from the substrate plane by their mass inertia when released out of an accelerated substrate and be fixedly anchored in a fully deflected position in an integral, positive or nonpositive manner.

For example, employing the inventive method in scanner mirrors, among other things, to form electrode combs for an electrostatic electrode drive or in the field of glass-encapsulated optical microsystems for reflex reduction of incident electromagnetic radiation is also conceivable. For example, a correspondingly designed two-dimensional structure containing a microscanner may be utilized to direct the reflected beam of rays of a scanner to another direction, as a beam of rays partially reflected on a glass cap of the micro scanner. Thus, it can be avoided to generate disturbing reflexes of the electromagnetic radiation in the workspace of the micro scanner. This may be particularly advantageous in display applications.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

The invention claimed is:

1. A method for manufacturing a micromechanical structure, comprising the steps of:
    forming a two-dimensional structure including an electrode and a counter electrode in a substrate;
    deflecting the counter electrode from a plane of the substrate by action of force; and
    fixing the counter electrode in a deflected state.

2. The method according to claim 1, further comprising releasing the two-dimensional structure in the substrate.

3. The method according to claim 1, wherein the substrate is a wafer.

4. The method according to claim 3, wherein the two-dimensional structure in the wafer is connected to the wafer via fixed bearings.

5. The method according to claim 1, wherein the step of deflecting the counter electrode structure includes a step of applying an internal, external, direct or indirect force, or an internal, external, direct or indirect moment.

6. The method according to claim 1, wherein the step of deflecting includes a step of activating an electrostatic, a magnetostatic, an electrostrictive, a magnetostrictive, a piezoelectric, or a thermal actor.

7. The method according to claim 1, wherein the step of deflecting is based on an intrinsical material tension of a bimorph.

8. The method according to claim 1, wherein the step of deflecting includes a step of applying an outside force by a micromanipulator.

9. The method according to claim 1, wherein the step of deflecting includes a step of applying an outside force field.

10. The method according to claim 9, wherein the outside force field is a gravitational field, a magnetic field, an electrical field, or a pneumatic pressure field.

11. The method according to claim 1, wherein the step of deflecting is based on a mass inertia of the two-dimensional structure when accelerating the substrate.

12. The method according to claim 1, wherein the step of fixing the counter electrode in the deflected state is made integrally, positively, or nonpositively.

13. The method according to claim 12, wherein the integral fixing includes bonding, sticking, soldering, welding or alloying.

14. The method according to claim 12, wherein the positive fixing includes mechanical latching.

15. The method according to claim 12, wherein the nonpositive fixing is based on adhesion forces, frictional forces or clamping forces.

* * * * *